United States Patent [19]
Fazio et al.

[11] Patent Number: 5,508,958
[45] Date of Patent: Apr. 16, 1996

[54] METHOD AND APPARATUS FOR SENSING THE STATE OF FLOATING GATE MEMORY CELLS BY APPLYING A VARIABLE GATE VOLTAGE

[75] Inventors: Albert Fazio, Los Gatos; Gregory E. Atwood, San Jose; Mark E. Bauer, Cameron Park, all of Calif.

[73] Assignee: Intel Corporation, Santa Clara, Calif.

[21] Appl. No.: 315,292

[22] Filed: Sep. 29, 1994

[51] Int. Cl.⁶ .................................................. G11C 7/00
[52] U.S. Cl. ...................... 365/185.19; 365/168
[58] Field of Search .................................. 365/184, 210, 365/168, 218, 185.33, 185.19

[56] References Cited

U.S. PATENT DOCUMENTS

| | | | |
|---|---|---|---|
| 5,043,940 | 8/1991 | Harari | 365/168 |
| 5,163,021 | 11/1992 | Mehrotra et al. | 365/185 |
| 5,270,979 | 12/1993 | Harari et al. | 365/185 |
| 5,394,359 | 2/1995 | Kowalski | 365/185 |
| 5,394,362 | 2/1995 | Banks | 365/168 |

FOREIGN PATENT DOCUMENTS 0392895 10/1990 European Pat. Off. .

*Primary Examiner*—David C. Nelms
*Assistant Examiner*—A. Zarabian
*Attorney, Agent, or Firm*—Blakely, Sokoloff, Taylor & Zafman

[57] ABSTRACT

A method and apparatus for sensing the state of floating gate memory cells in a memory array. Because of its stability and accuracy, the sensing apparatus may be used for sensing the state of multi-bit floating gate memory cells. The state of a memory cell is sensed by applying a variable gate voltage to the top gate of the floating gate memory cell and comparing the cell current to a fixed reference current. A circuit detects when the cell current is equal to the reference current. When the currents are equal, the value of the variable gate voltage indicates the state of the memory cell. For one embodiment, an analog-to-digital converter converts the variable gate voltage to a digital value that is latched when the currents are equal. The latched digital value indicates the state of the memory cell. For this embodiment, a ramp voltage or other suitable variable voltage may be used as the variable gate voltage. For another embodiment, a digital-to-analog converter is used to generate the variable gate voltage. A counter generates digital values to step the variable gate voltage. When the cell current equals the fixed reference current, the digital counter value is latched to indicate the state of the memory cell.

26 Claims, 9 Drawing Sheets

State Width
- Reference cell trim errors
- Temperature effects
- power supply and $g_m$ variations
- Disturb mechanisms
- State placement width
- Sensing errors Cell Current, I $I_{REF}$ State 0 | State 1 | State 2 | State 3

Top Gate Voltage, $V_{TG}$

METHOD AND APPARATUS FOR SENSING THE STATE OF FLOATING GATE MEMORY CELLS BY APPLYING A VARIABLE GATE VOLTAGE

FIELD OF THE INVENTION

The present invention relates generally to sensing the state of memory cells in a memory array. More specifically, the present invention relates to sensing the state of flash memory cells storing multiple bits per cell by applying a variable gate voltage to the gates of the cells and detecting the gate voltage that generates a cell current equal to a fixed reference current.

BACKGROUND OF THE INVENTION

Various types of prior floating gate memories are known, such as erasable programmable read-only memory ("EPROM"), electrically-erasable programmable read-only memory ("EEPROM"), and the flash electrically-erasable programmable read-only memory ("flash EEPROM"). One prior flash memory technology is the ETOX™ II technology of Intel Corporation of Santa Clara, Calif. FIG. 1A shows a prior ETOX™ II flash memory cell 10 of Intel Corporation. Prior flash memory cell 10 has a top gate 12, a floating gate 14, a source 16, and a drain 18. Source 16 and drain 18 reside within a substrate 20. Substrate 20 is grounded. Flash memory cell 10 is comprised of a single transistor. FIG. 1B shows a symbolic representation of flash memory cell 10 that is used to represent flash memory cell 10 in circuit schematics.

Referring again to FIG. 1A, floating gate 14 is used for charge storage. The logic state of flash memory cell 10 is determined by the amount of charge stored on floating gate 14. Electrons are placed on floating gate 14 during a programming process by a mechanism known as hot electron injection. Electrons are removed from floating gate 14 during an erase process by a mechanism known as tunneling. Source 16 comprises a top n+ region and a bottom n region that together create a graded junction capable of withstanding a high source voltage during erase. FIG. 1C illustrates certain current and voltage characteristics of flash memory cell 10. Curve 32 is an I–V characteristic of flash memory cell 10 when floating gate 14 stores little or no charge, i.e. the cell is in an erased state. In this state, flash memory cell 10 is said to store a logic 1. Curve 34 is an I–V characteristic of flash memory cell 10 when floating gate 14 stores substantial charge. In this state, flash memory 10 is said to store a logic 0. Curves 32 and 34 show that charge stored on floating gate 14 shifts the I–V characteristic of memory cell 10 to the right. In other words, charge stored on floating gate 14 increases the threshold voltage of the flash memory cell 10.

The logic state of a memory cell is sensed (or detected) during either a read or verify operation. A read operation reads the data stored in the cell for delivery to another unit. A verify operation reads the data stored in the cell after programming to verify that the cell has been programmed to the proper state. Sensing is the process of determining the logic state of, or data stored in, a memory cell. Reference curve 36 is a I–V characteristic of a flash reference cell that may be used for sensing the state of flash memory cell 10. A logic 1 is sensed if the drain current of flash memory cell 10 is greater than the drain current of the flash reference cell (corresponding the I–V characteristic of flash memory cell 10 being to the left of reference curve 36). A logic 0 is sensed if the current of flash memory cell 10 is smaller than the current of the flash reference cell (corresponding to the I–V characteristic of flash memory cell 10 being to the right of reference curve 36). Typical prior commercial flash memory devices have stored only two logic states, logic 0 and logic 1 (i.e., one bit per cell), in each flash memory cell due in part to difficulties with accurately programming and sensing intermediate amounts of charge on floating gate 14.

FIG. 1A shows one prior configuration for sensing the logic state of flash memory cell 10. For sensing, the drain voltage, $V_D$, is set to about 1.0 volts, the source 16 is grounded, and the top gate voltage, $V_{TG}$, is set to a fixed voltage on the order of 5.0 volts. (Typically the supply voltage, $V_{CC}$, is used as the fixed voltage.) The drain current is sensed to determine whether flash memory cell 10 stores a logic 0 or a logic 1. A high drain current (indicating little or no charge on floating gate 14) indicates a logic 1 while a low drain current (indicating substantial charge on floating gate 14) indicates a logic 0.

FIG. 2A shows a prior sensing circuit 40 for sensing the logic state of a flash memory cell 48. Flash memory cell 48 is one cell of an array of flash memory cells. Sensing circuit 40 includes a first chain of serially-connected n-type transistors comprising: a load transistor 42, a cascode transistor 44, and a column select transistor 46. At the end of the first transistor chain is flash memory cell 48 which has been selected for sensing by the appropriate column and row select lines of the flash memory array. A drain bias circuit 47, including cascode transistor 44 and a feedback inverter 45, isolates load transistor 42 from selected flash memory cell 48 and establishes a constant drain bias voltage of about 1.0 volts at the drain of flash memory cell 48. A fixed voltage $V_{CC}$ of about 5.0 volts is applied to the top gate of flash memory cell 48 causing a current I1 to flow in flash memory cell 48 and through the first transistor chain. The magnitude of current I1 is a function of the logic state of flash memory cell 48, (i.e., a function of the amount of charge stored on the floating gate of flash memory cell 48). The current I1 establishes a voltage at node SEN1 50 according to the I–V characteristic of load transistor 42 shown in FIG. 2B.

Referring again to FIG. 2A, voltage $V_{SEN1}$ at node SEN1 50 is compared to a reference voltage $V_{REF}$ established by a second transistor chain at node REF 60. The second chain of serially-connected n-type transistors includes a load transistor 52, a cascode transistor 54, and a reference select transistor 56, which respectively match the corresponding transistors of the first chain. Flash reference cell 58 is coupled to the end of the second transistor chain and is typically charged to have a reference characteristic similar to reference curve 36 of FIG. 1C. A drain bias circuit 57, including cascode transistor 54 and a feedback inverter 55, isolates load transistor 52 from flash reference cell 58 and establishes a constant drain bias voltage of about 1.0 volts at the drain of flash reference cell 58. The current in flash reference cell 58 is convened to the reference voltage $V_{REF}$ at node REF 60. Differential amplifier 62 compares $V_{SEN1}$ to $V_{ref}$ to determine the state of flash memory cell 48. Detecting $V_{SEN1}$ greater than $V_{REF}$ indicates logic state 0. Detecting $V_{SEN1}$ less than $V_{REF}$ indicates logic state 1.

Prior sensing circuit 40 is suitable for fast sensing of widely separated states, but suffers from significant problems when sensing of closely-spaced states is required. The voltage range of $V_{sen1}$ is typically designed to be between about 1.5 and 3.0 volts. The low end voltage on node SEN1 50 is limited by the practical concerns of keeping differential amplifier 62 in its operational range and maintaining a constant drain bias voltage on flash memory cell 48. The high end voltage on node SEN1 50 is limited by $V_{CC}$, the $V_t$ drop of load transistor 42, and the common mode rejection of the differential amplifier. FIG. 2B illustrates the voltage $V_{SEN1}$ at node SEN1 50 as a function of current I1. A typical two state (i.e., one bit) memory cell defines logic states to correspond to the I1 and $V_{SEN1}$ corresponding to numbers 1 and 4 of the graph. For two states, the difference between the $V_{SEN1}$ voltages corresponding to numbers 1 and 4 is relatively large. A four state (i.e., two bit) memory cell could define four logic states (such as 11, 10, 01, and 00) to correspond to numbers 1–4. With four states, the voltage differences between adjacent $V_{SEN1}$ voltages is much smaller, making logic state sensing more difficult.

In an array of memory cells, other problems increase the difficulty of sensing states with prior sensing circuit 40 when multiple bits are stored in the memory cells. Typical commercial flash memory devices comprise millions of flash memory cells in a memory array. Due to non-ideal processing conditions during manufacturing, individual memory cells across the array have different characteristics. Varying cell characteristics, fluctuations in power supply voltages, variations in array sensitivity to temperature, and variations in array transconductance, can each cause the $V_{SEN1}$ voltage to vary from ideal. To allow for such variations, a range of values is assigned to each state. In other words, each state has a state width to account for variations that affect sensing. The state width, in part, determines how many states a memory cell can store.

One factor contributing to the state width is fluctuation in power supply voltages. Power supply voltages vary within a specified tolerance over time. For example, a 5.0±5% supply voltage may fluctuate between 4.75 and 5.25 volts over time. If the supply voltage during programming is different than during sensing of a memory cell, the sensed state will be offset from its ideal value.

Another factor contributing to the state width is cell to cell variations in temperature sensitivity in a memory array. As temperature increases electron mobility, $\mu_e$, decreases and threshold voltage, $V_{tFG}$, decreases. The impact of temperature changes on individual flash memory cells can be understood by examining Equation 1.

$$I_D \propto q\mu_e C_{ox} \frac{Z_{eff}}{L_{eff}} (V_{FG} - V_{tFG})^x \qquad \text{(EQ. 1)}$$

For a state very close to the power supply voltage (i.e., the floating gate is charged to approximately the power supply voltage), $(V_{FG}-V_{tFG})$ is very small causing changes in $V_{tFG}$ to dominate the temperature effect. Therefore, in this case rising temperature causes $V_{tFG}$ to decrease and $I_D$ to increase. For a state far away from the power supply voltage, temperature effects are dominated by $\mu_e$ since $(V_{FG}-V_{tFG})$ is large. Therefore, in this case rising temperature causes $I_D$ to decrease. In other words, rising temperature decreases drain current in cells having a high drain current during sensing but increases drain current in cells having a small drain current during sensing. Thus, in the prior sensing scheme, temperature affects arrays cells differently depending on their programmed state. Also, even for cells programmed to the same state there are cell-to-cell variations in sensitivity to temperature changes. So variations in temperature affects also contributes to the state width.

Another factor contributing to the state width is variations in cell transconductance across a memory array. Transconductance of a field effect device such as a flash memory cell is defined in equation 2.

$$g_m = q\mu_e \frac{Z_{eff}}{L_{eff}} \qquad \text{(EQ. 2)}$$

Due to non-ideal processing conditions during manufacturing, the width and length (Zeff and Leff) of individual cells (of the millions in a typical memory array) vary. The resulting transconductance variations cause individual cells in the array to have different I–V characteristics.

In summary, power supply variations, temperature effects, temperature effect variations, and transconductance variations each contribute to the state width. Because these factors require a relatively large state width and the prior sensing circuit 40 has a relatively narrow sensing range of 1.5 to 3.0 volts on the sensing node SEN1 50, it is difficult to use prior circuit 40 for sensing of multi-bit memory cells.

SUMMARY AND OBJECTS OF THE INVENTION

One of the objects of the present invention is to provide a method and apparatus for sensing the state of a floating gate memory cell by applying a variable gate voltage to the memory cell and sensing the state of the memory cell when the cell current is substantially equal to a fixed reference current.

Another of the objects of the present invention is to sense the state of individual memory cells in an array of memory cells at substantially the same cell condition, i.e. to sense individual memory cells at substantially the same cell current and effective gate voltage (effective $V_G-V_t$).

Another of the objects of the present invention is to reduce the sensitivity of memory cell state sensing to temperature, power supply, and transconductance variations.

Another of the objects of the present invention is to sense the states of multi-bit memory cells.

An apparatus for determining a state of a memory cell that is programmed to one of a plurality of states is described. The apparatus includes a circuit for applying a variable voltage to the memory cell. The memory cell generates a cell current that is proportional to the variable voltage. Another circuit generates a fixed reference current. The cell current and the fixed reference current are input to a circuit that detects when the cell current is substantially equal to the fixed reference current. Another circuit determines the state of the memory cell according to a value of the variable gate voltage when the cell current is substantially equal to the fixed reference current.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings in which like references indicate similar elements.

DETAILED DESCRIPTION

One way to increase the storage density of floating gate non-volatile memory devices (such as flash memory devices) is by storing multiple bits in a single memory cell. Because the floating gate can store a wide range of charge values (quantized by the charge of a single electron), different amounts of charge can be used to represent different states in a memory cell. These different states can then be equated to bit patterns to produce a multi-bit storage element. For example, 16 states (16 unique charge values on the floating gate) could be used to represent four bits of binary data. Such a device would be a four bit memory cell.

Figure 1A:
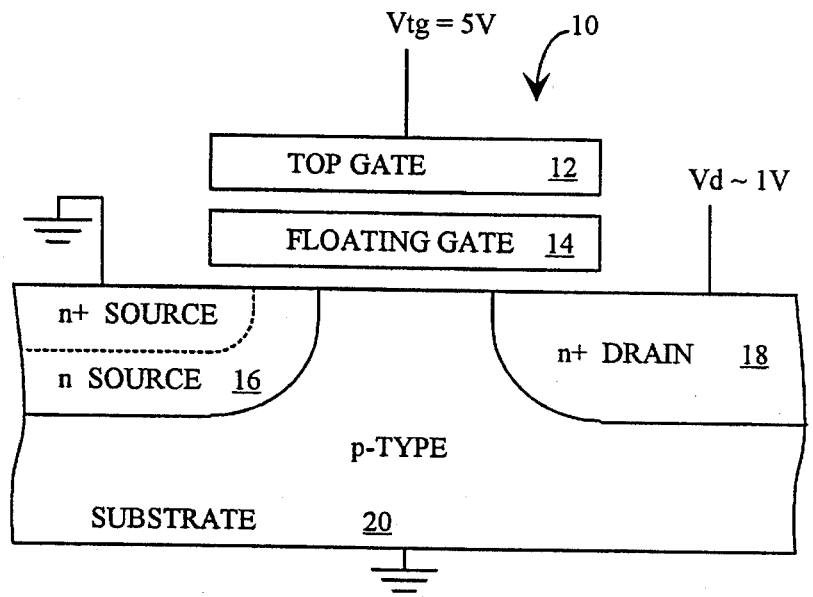
FIG. 1A is a cross-sectional illustration of a prior art flash memory cell being sensed.
Figure 1B:
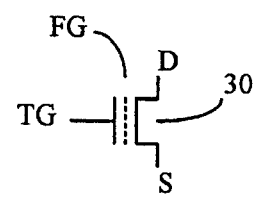
FIG. 1B is a circuit symbol for floating gate memory cells, such as the flash memory cell of FIG. 1A.
Figure 1C:
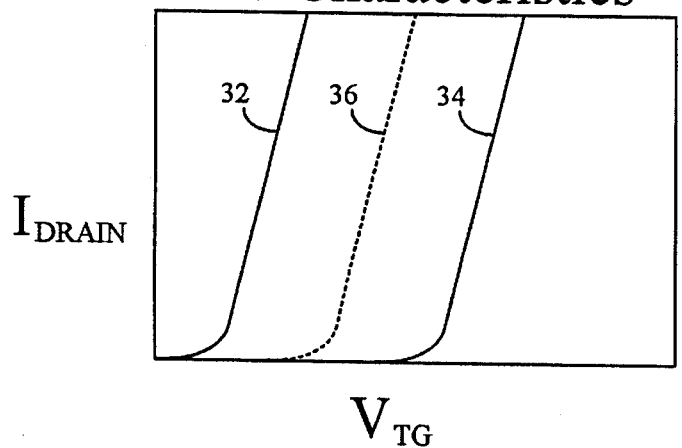
FIG. 1C illustrates certain current and voltage characteristics of the flash memory cell of FIG. 1A.
Figure 2A:
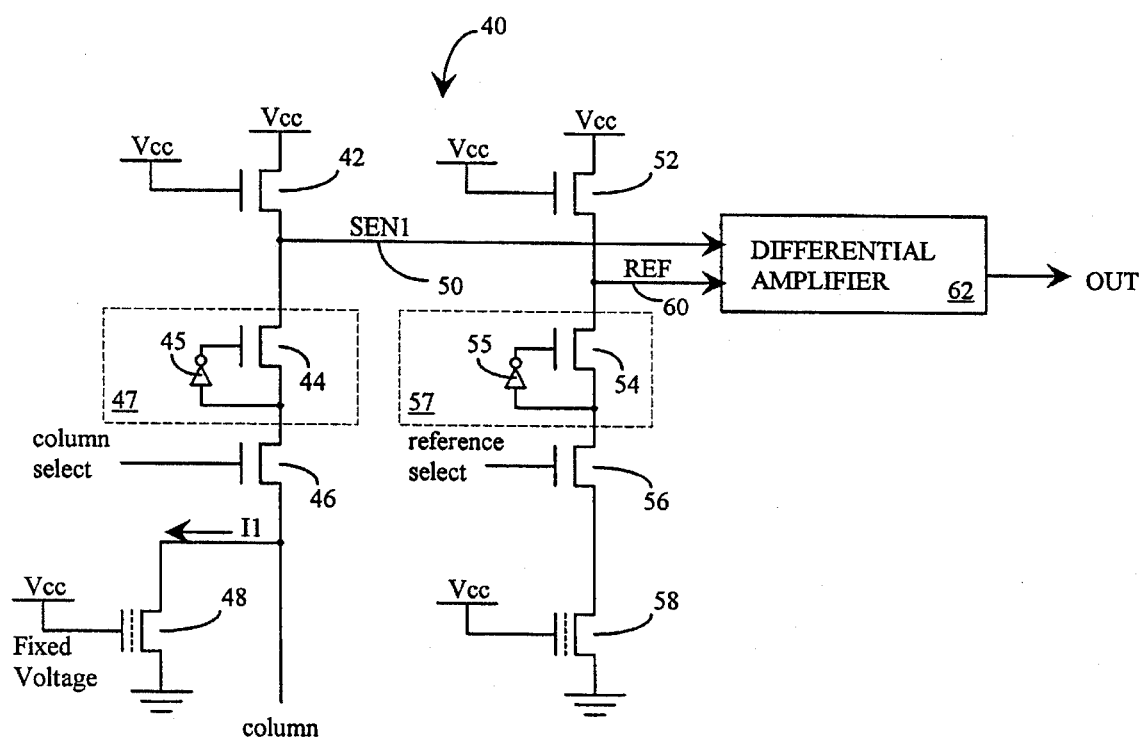
FIG. 2A is an electrical circuit schematic of a prior art sensing circuit.
Figure 2B:
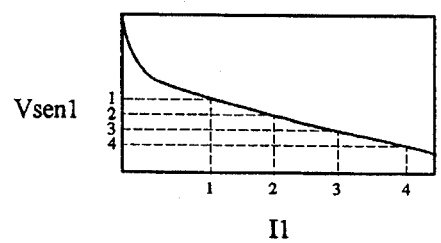
FIG. 2B is a graph of the voltage at node SEN1 50 as a function of the current I1 of the circuit of FIG. 2A.
Figure 3A:
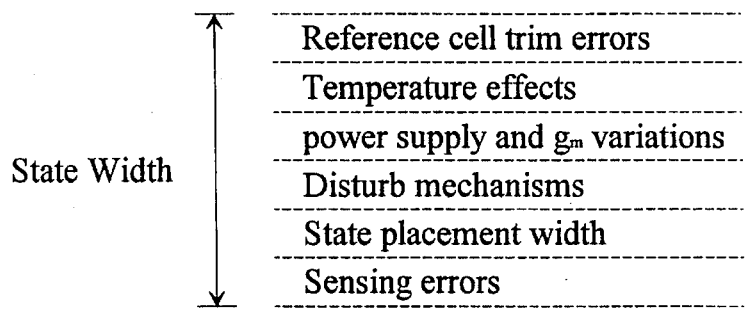
FIG. 3A illustrates some factors that can contribute to the state width.

Practical considerations limit how many states can reliably be programmed and sensed in floating gate memory cells. Each state is assigned a range of values, i.e. a state width, to account for various non-ideal factors. FIG. 3A illustrates some factors that can contribute to the state width of a sensing scheme. The state width of FIG. 3A includes factors of state placement width, disturb mechanisms, power supply and $g_m$ variations, temperature effects, reference trim errors, and sensing errors. State placement width refers to errors that occur in programming a state due to noise, supply voltage variation, etc. Disturb mechanisms refer to errors due to leakage of electrons to or from the floating gates of either array cells or reference cells. Power supply and $g_m$ variations refer to supply voltage and cell-to-cell transconductance variations that cause sensing errors. Temperature effects refer to errors due to the temperature dependence of cell drain current. Reference trim errors refers to errors in trimming (or setting) the values of the reference cells. Finally, sensing errors refer to errors due to offsets and inaccuracies of the sensing circuitry.

For sensing, multiple states must be allocated to defined regions. Window budget is the allocation of the state window, the difference between an erased state (no charge on the floating gate) and the highest programming state, to the intervening states. The state width required for accurate and reliable sensing and the width of the state window determine in part how many states can be defined in a window budget. Therefore, the state width and state window determine in part how many bits can be reliably programmed and sensed per memory cell.

Figure 3B:
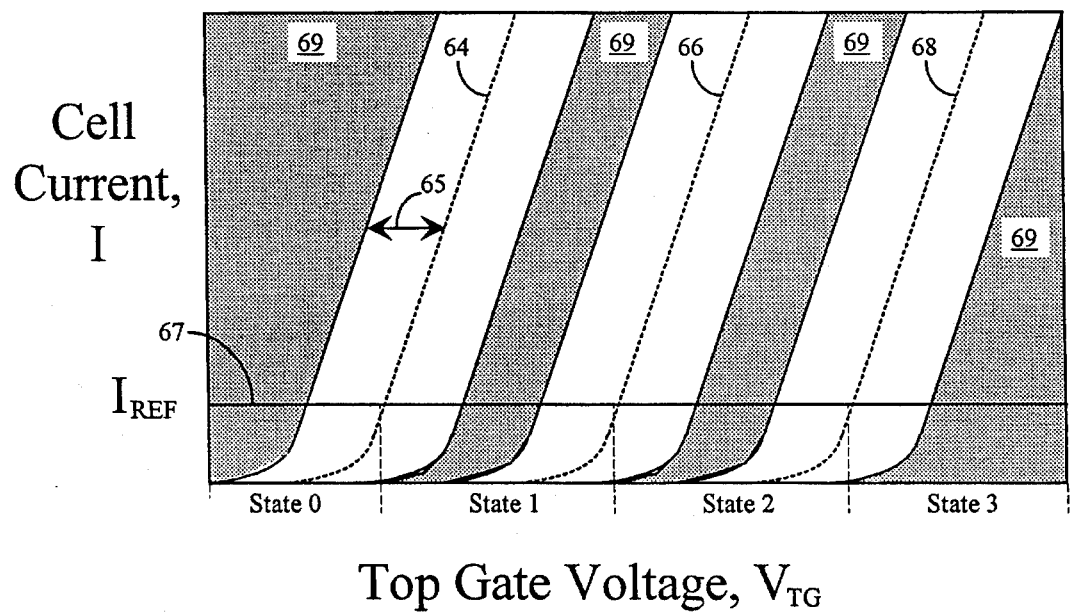
FIG. 3B is a plot illustrating allocation of the I–V characteristics of a floating gate memory cell into four states: state0, state1, state2, and state3.

FIG. 3B illustrates the allocation of the I–V characteristics of a flash memory cell to four states (states 0–3) to provide two bits of storage per cell. Recall that the effect of storing electrons on the floating gate of a flash memory cell is to shift the cell's I–V characteristic curve to a lower current (to the right) for a given gate voltage. I–V characteristics 64, 66, and 68 are reference curves that are representative of the characteristics of three flash reference cells used in sensing. Gray-shaded areas 69 define the state placement width for each state. A gap 65 defines the minimum separation between a reference characteristic and the adjacent state placement width. Gap 65 corresponds to the above-discussed state width factors except state placement.

During sensing, the characteristics of a flash memory cell being sensed are compared to reference characteristics 64, 66, and 68 to determine the state of the cell. One prior sensing scheme applies a fixed gate voltage to the cell and senses the drain current to determine the state of the flash memory cell. In contrast to this prior scheme, the present sensing scheme applies a variable gate voltage (VGV) to the cell and detects the gate voltage that generates a cell current equal to a reference current, $I_{REF}$. The detected gate voltage indicates the state of the sensed flash memory cell. The reference current at which sensing occurs and the state significance of the detected gate voltage are illustrated in FIG. 3B by the horizontal $I_{REF}$ current line 67 and the four ranges of top gate voltages that correspond to states 0–3. Note that in the present sensing scheme, all cells are sensed in the same condition—i.e., at the same drain current and effective gate voltage (effective $V_G - V_t$).

Figure 4A:
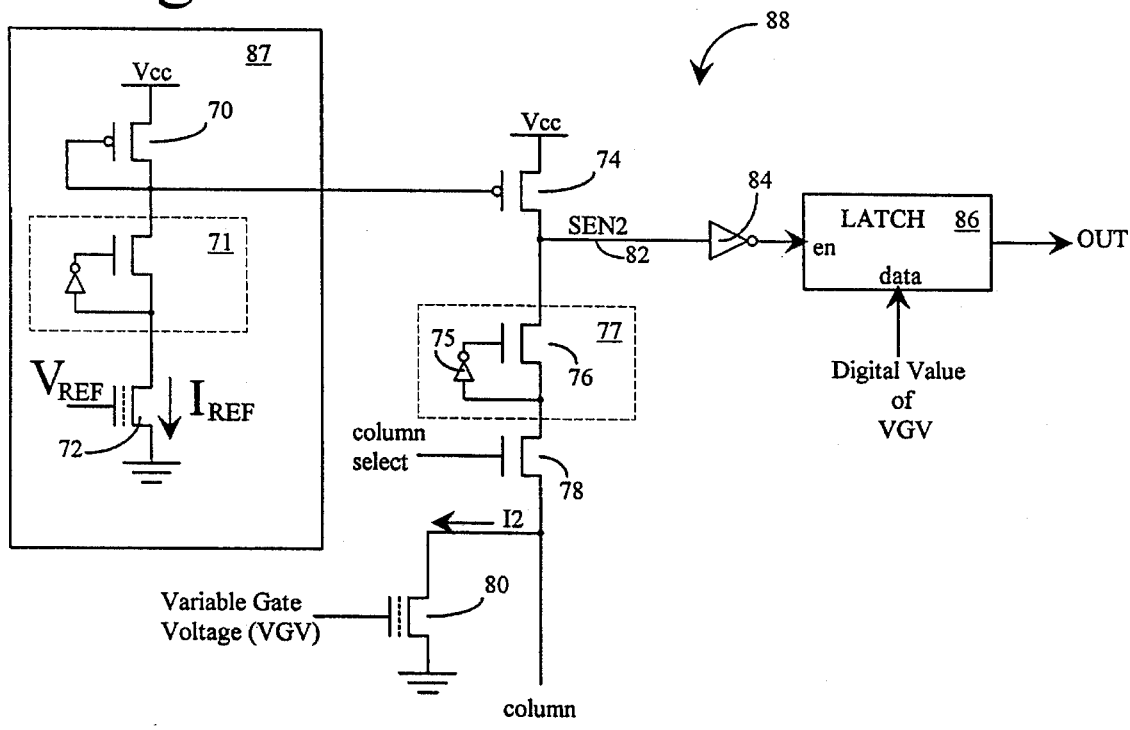
FIG. 4A is an electrical circuit schematic of a circuit for sensing the state of memory cells by applying a variable gate voltage.

FIG. 4A is a circuit schematic of a sensing circuit 88 for sensing the state of floating gate memory cells by applying a variable gate voltage. Sensing circuit 88 includes a reference current generator circuit 87 comprising a p-type transistor 70, a drain bias circuit 71, and a flash cell 72. The source of p-type transistor 70 is coupled to supply voltage $V_{CC}$ and its gate is coupled to its drain. The drain of p-type transistor 70 is coupled to the drain bias circuit 71. The drain bias circuit 71 is coupled to the drain of flash cell 72. The gate of flash cell 72 is coupled to a fixed reference voltage, $V_{REF}$, and its source is coupled to ground. Coupled in this manner, the reference current generator generates a fixed reference current, $I_{REF}$. The charge stored on the floating gate of flash cell 72 may be adjusted in order to trim the $I_{REF}$ current to a particular value.

Sensing circuit 88 also includes four serially-connected transistors: a p-type load transistor 74, an n-type cascode transistor 76, an n-type column select transistor 78, and a flash memory cell 80 that has been selected for sensing. The source of load transistor 74 is coupled to supply voltage $V_{CC}$ and the source of flash memory cell 80 is grounded. The gate of load transistor 74 is coupled to reference current generator circuit 87 at the drain of transistor 70. The drain of load transistor 74 is coupled to a node SEN2 82. For one embodiment, transistors 70 and 74 and flash cells 72 and 80 are respectively designed to have matching characteristics.

A drain bias circuit 77, including cascode transistor 76 and a feedback inverter 75, isolates load transistor 74 from selected flash memory cell 80 and establishes a constant drain bias voltage of about 1.0 volts at the drain of flash memory cell 80. The gate of transistor 78 is coupled to a column select signal that selects a particular column of the flash memory array for sensing. A row select device (not shown) selects a particular flash memory cell on the selected column.

Figure 4B:
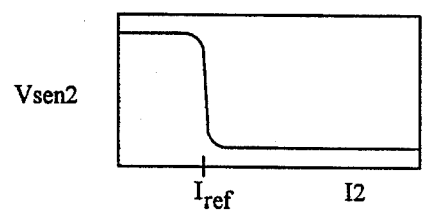
FIG. 4B is a graph of the voltage at node SEN2 82 as a function of the current I2, both of the sensing circuit 88 of FIG. 4A.

A variable gate voltage (VGV) is applied to the gate of flash memory cell 80 generating a current I2 in flash memory cell 80. For one embodiment, a variable gate voltage increasing from zero volts is used. For other embodiments, other types of variable gate voltages are used. The current I2 also flows through load transistor 74 which generates a voltage $V_{SEN2}$ at node SEN2 82 according to the I-V characteristic of FIG. 4B. As shown in FIG. 4B, when the variable gate voltage is such that current I2 is substantially equal to the reference current $I_{REF}$, a sharp voltage transition occurs at node SEN2 82.

Referring again to FIG. 4A, node SEN2 82 is coupled to the input of an inverter 84 whose output is coupled to the enable input of a latch 86. The data input of latch 86 is coupled to receive the digital value of the variable gate voltage. Latch 86 latches the digital value of the variable gate voltage in response to the voltage transition on node SEN2 82 that occurs when the cell current I2 is substantially the same as the reference current $I_{REF}$. The latched digital value represents the sensed state of memory cell 80.

In summary, the operation of sensing circuit 88 is as follows. Fixed reference current $I_{REF}$ is generated. The variable gate voltage is applied to the gate of flash memory cell 80 establishing current I2 in cell 80. Current I2 flows through load transistor 74 which establishes a voltage at node SEN2 82 according to the characteristics of FIG. 4B. When the cell current I2 is substantially equal to the current $I_{REF}$, a very steep voltage transition from about $V_{CC}$ (typically 5.0 volts) to about 0.0 volts occurs at node SEN2 82. The voltage transition causes latch 86 to latch the digital value of the variable gate voltage. The digital VGV value stored in latch 86 represents the state of flash memory cell 80.

One advantage is that sensing circuit 88 helps to improve the accuracy of state sensing. The steep voltage transition that occurs when the reference current is detected provides accurate sensing of cells at the same condition. The accurate sensing provided by the sensing circuit 88 allows a smaller state width.

Another advantage of sensing circuit 88 is that the reference current $I_{REF}$ (at which state sensing occurs) can be chosen to be relatively independent of temperature thereby providing sensing that is substantially temperature independent. As explained in the background on field-effect devices (such as flash memory cells), at low drain currents rising temperature causes drain current to increase, but at high drain currents rising temperature causes drain current to decrease. At an intermediate drain current, the opposing temperature effects cancel each other making the memory cell characteristics substantially independent of temperature. For one embodiment, the reference current of the sensing circuit 88 is chosen such that sensing occurs when the cell drain currents are substantially independent of temperature. For one embodiment, a reference current $I_{REF}$ of about 10–20 µA has been found to provide sensing that is substantially independent of temperature. Temperature independent sensing allows the state width to be reduced since temperature effects are minimized.

Another advantage of sensing circuit 88 is that it helps to minimize the sensitivity to fluctuations in power supply voltages. The transconductance $g_m$ of load transistor 74 is relatively small, meaning that power supply voltage variations are magnified by a lower transconductance $g_m$. In addition, the reference current, at which sensing occurs, can be chosen to minimize the effects of transconductance variation. Thus, transconductance considerations are reduced, allowing the state width to be reduced.

The advantages of improved sensing accuracy, temperature independent sensing, and minimized transconductance effects provided by sensing circuit 88 each help to reduce the required state width. Therefore, sensing circuit 88 helps to provide room for more states in the state window thereby allowing more bits to be stored in each memory cell.

Figure 5A:
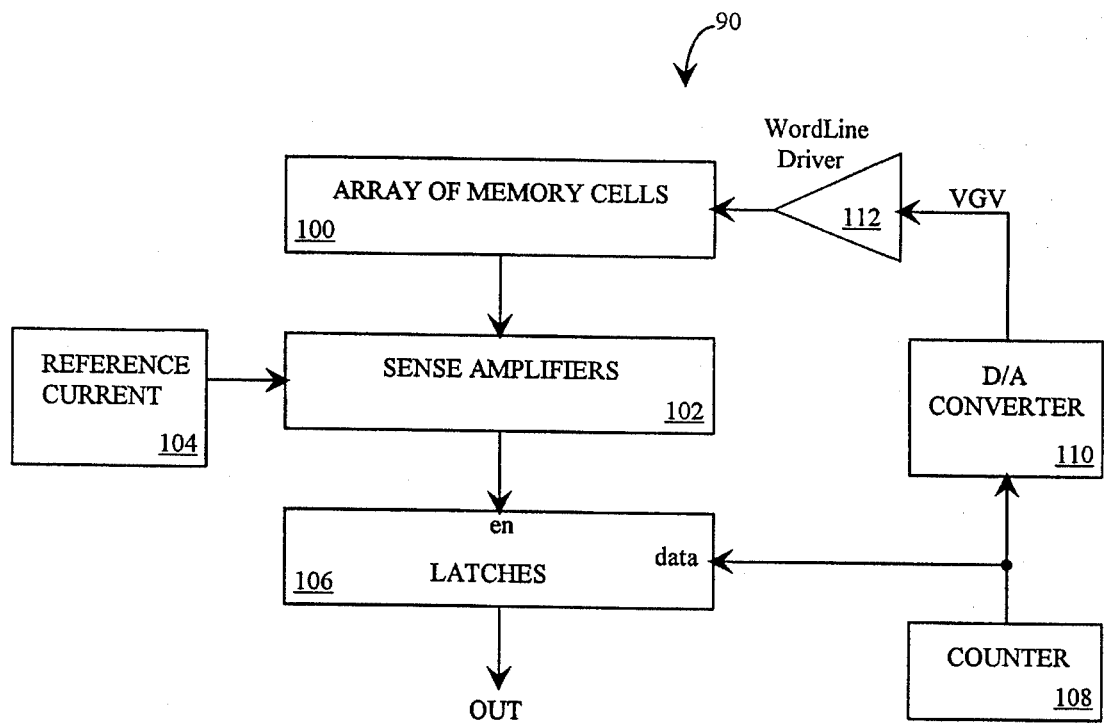
FIG. 5A is a block diagram of a sensing circuit that utilizes a digital-to-analog (D/A) converter to generate a variable gate voltage (VGV).
Figure 5B:
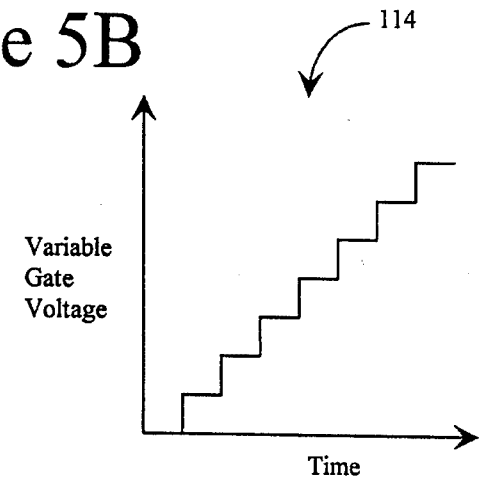
FIG. 5B is a plot illustrating a stepped voltage produced by a D/A converter.

FIG. 5A is a block diagram of a sensing circuit 90 that utilizes a digital-to-analog converter for generating the variable gate voltage. A counter 108 generates a digital counter value that is input to a plurality of latches 106 and a digital-to-analog (D/A) converter 110. D/A converter 110 generates a variable gate voltage in response to the digital counter value. For one embodiment, the digital counter value is sequentially incremented such that a stepped variable gate voltage (as shown in FIG. 5B) is generated. For other embodiments, counter 108 generates predetermined digital values to produce predetermined variable gate voltages.

Referring again to FIG. 5A, the variable gate voltage is input to a wordline driver 112 that applies the variable gate voltage to the gates of memory cells in array 100 that have been selected for sensing. For one embodiment, memory cells 100 are flash memory cells. Each memory cell selected for sensing is coupled to a sense amplifier 102 that detects when a cell current equal to a fixed reference current is generated in that memory cell. A reference current generator 104 provides the fixed reference current to the sense amplifiers 102.

Sense amplifiers 102 are correspondingly coupled to enable inputs of a plurality of latches 106 such that latches 106 latch the digital counter value when a corresponding sense amplifier 102 detects the fixed reference current. The latched digital counter value indicates the state of the corresponding sensed memory cell. The output of latches 106 are read to provide the digital data stored in the sensed memory cells of array 100.

Figure 6:
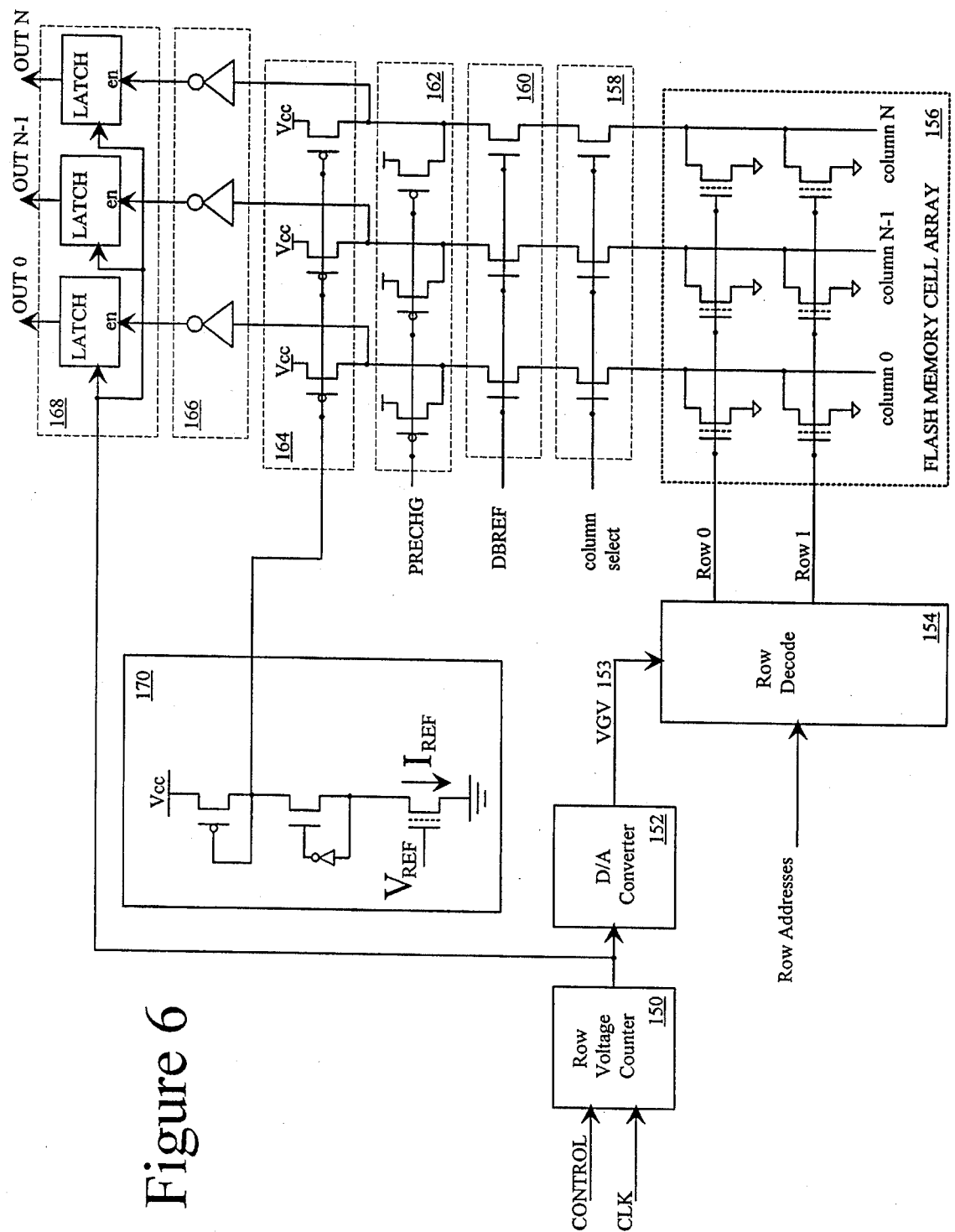
FIG. 6 is an electrical circuit schematic of another circuit for sensing the state of memory cells by applying a variable gate voltage.

FIG. 6 is an electrical circuit schematic of a flash memory array 156 and associated sensing circuitry. A row voltage counter 150 generates a digital counter value in response to a CLK and CONTROL signals. A digital-to-analog (D/A) converter 152 generates a variable gate voltage 153 in response to the digital counter value. A row decode block 154 applies the variable gate voltage 153 to one of a plurality of rows in a flash memory cell array 156 in response to a row address. Flash memory cell array 156 comprises individual flash memory cells organized into rows and columns. The columns of array 156 are coupled to column select transistors 158 that select particular columns of array 156 for sensing.

A plurality of cascode transistors 160 are coupled to column select transistors 158 for establishing a voltage of about 1.0 volts on the drain of each memory cell selected for sensing. Precharge transistors 162 are coupled to the cascode devices 160 for precharging the columns to about 1.0 volts before sensing begins. A plurality of p-type load transistors 164 are coupled to the cascode transistors 160 to provide a load transistor for each memory cell selected for sensing. The gates of load transistors 164 are coupled to a reference current generator 170. Reference current generator 170 generates a fixed reference current, $I_{REF}$, that determines the cell current at which sensing will occur. The drain of each load transistor 164 is coupled to an inverter 166. The outputs of inverters 166 are coupled to the enable inputs of a plurality of latches 168. The data inputs of latches 168 are coupled to received the digital counter value generated by row voltage counter 150.

Figure 7A:
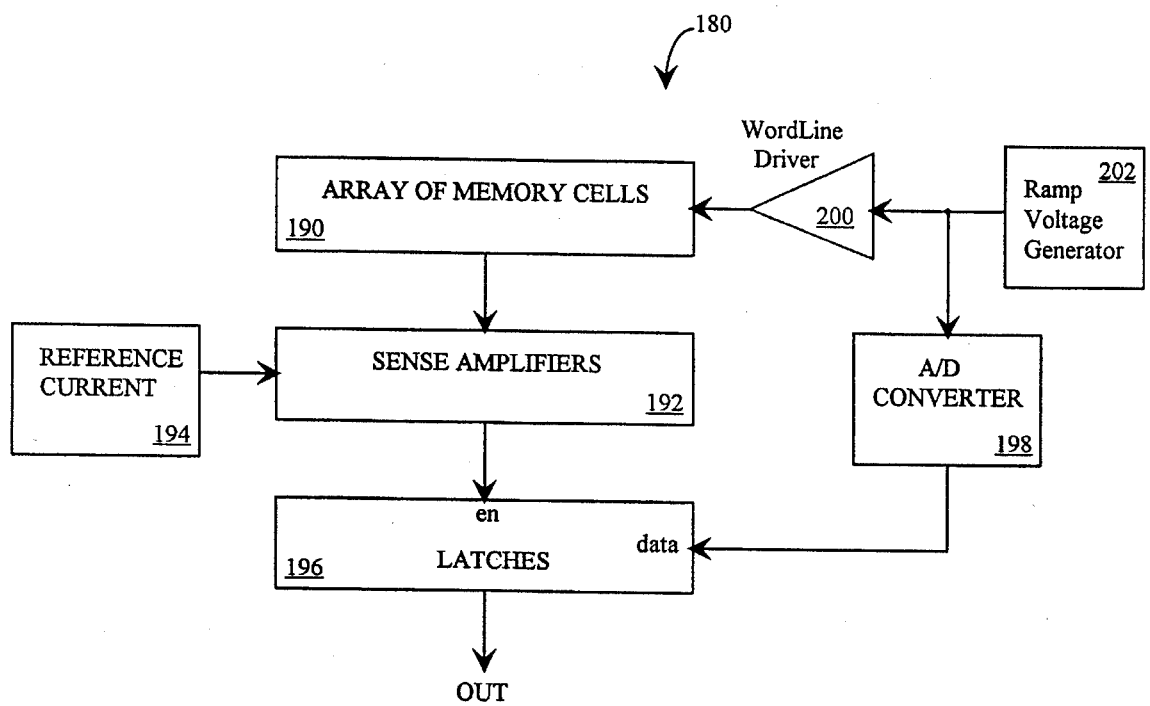
FIG. 7A is a block diagram of a sensing circuit that utilizes a ramp voltage and an analog-to-digital (A/D) converter.
Figure 7B:
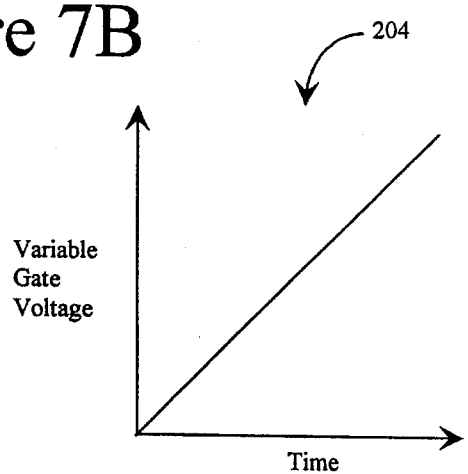
FIG. 7B is a plot illustrating a typical ramp voltage.

FIG. 7A is a block diagram of a sensing circuit 180 that utilizes a ramp voltage generator 202 and an analog-to-digital (A/D) converter 198. Ramp voltage generator 202 generates a ramp voltage that is the variable gate voltage. A ramp voltage is either a linearly increasing or decreasing voltage. One example of a variable gate ramp voltage 204 is shown in FIG. 7B. Referring again to FIG. 7A, the variable gate voltage is input to an A/D converter 198 that generates a digital value of the variable gate voltage.

The variable gate voltage is also input to a wordline driver 200 that applies the variable gate voltage to the gates of memory cells in array 190 that have been selected for sensing. Each memory cell selected for sensing is coupled to a sense amplifier 192 that detects when a cell current substantially equal to a fixed reference current is generated in that memory cell. A reference current generator 194 provides the fixed reference current to the sense amplifiers 192.

Sense amplifiers 192 are correspondingly coupled to enable inputs of a plurality of latches 196 that latch the digital counter value when the corresponding sense amplifier 192 detects a cell current substantially equal to the fixed reference current. The latched digital counter value indicates the state of the corresponding sensed memory cell. The output of latches 196 are read to provide the digital data stored in the sensed memory cells of array 190.

Figure 8:
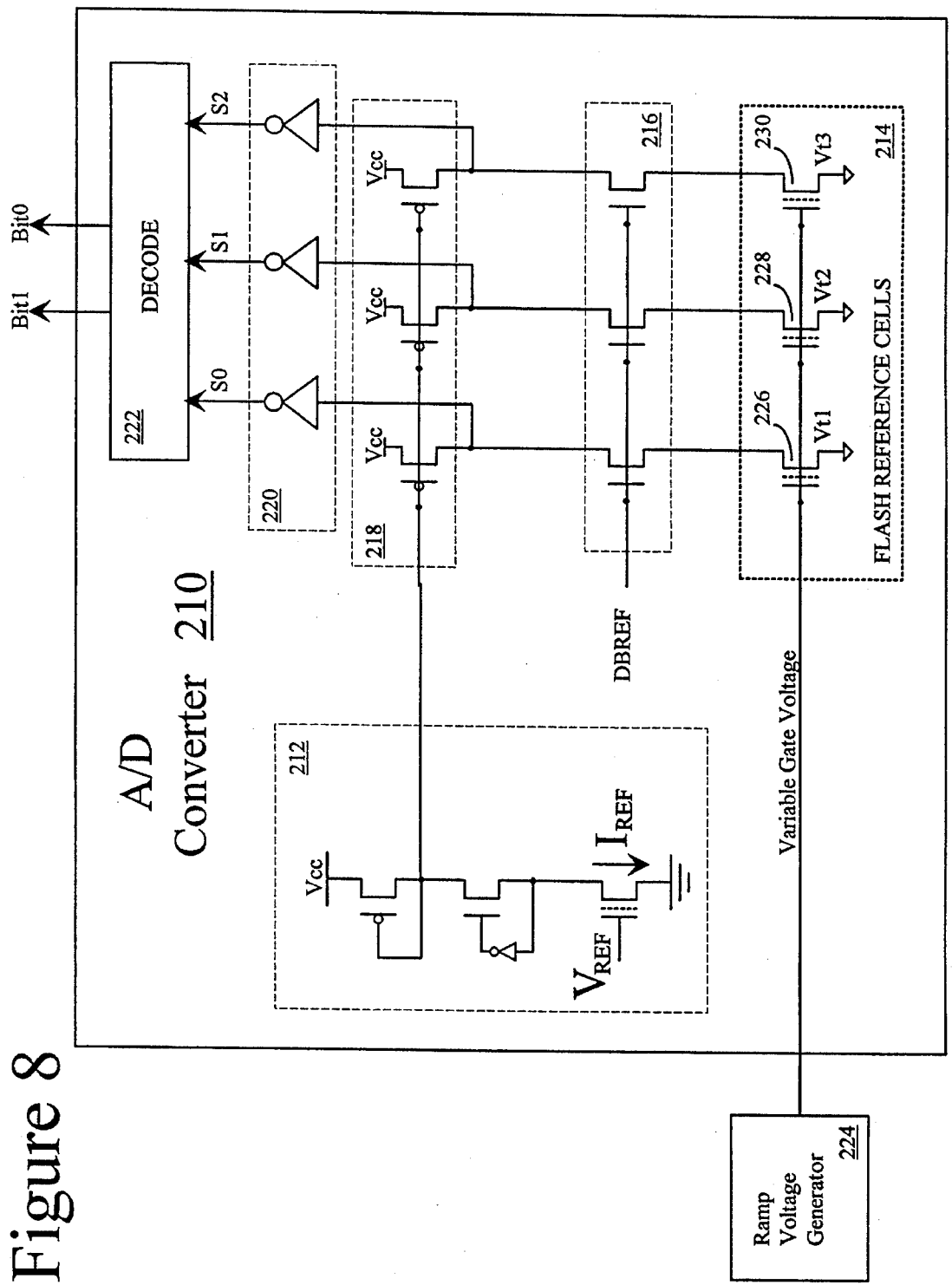
FIG. 8 is a circuit schematic of an A/D converter that may be used as part sensing circuit 180 of FIG. 7A.

FIG. 8 is a circuit schematic of a flash-based analog-to-digital converter 210 that may be advantageously used as the A/D converter 198 for the embodiment of FIG. 7A. A ramp voltage generator 224 generates a ramp voltage as the variable gate voltage. The variable gate voltage is applied to the gates of flash reference cells 226, 228, and 230. Flash reference cells 226, 228, and 230 are programmed (or charged) to have threshold voltages Vt1, Vt2, and Vt3, respectively, where Vt1<Vt2<Vt3.

One of a plurality of cascode transistors 216 is serially coupled to each of flash reference cells 214 to provide a voltage of about 1.0 volts on the drains of flash reference cells 214. One of a plurality of p-type load transistors 218 is serially coupled to each of cascode transistors 216. A reference current generator 212 generates a fixed reference current, $I_{REF}$. Reference current generator 212 is coupled to the gates of load transistors 218. The drain of each of load transistors 218 is coupled to an input of one of a plurality of inverters 220.

The inverters coupled to flash reference cells 226, 228, and 230 generate signals S0, S1, and S2, respectively. A decode logic 222 receives the S0, S1, and S2 signals and decodes them to generate Bit1 and Bit0 signals. Decode logic 222 comprises combinational logic. Bit1 and Bit0 provide a two bit digital conversion value of the input variable gate voltage. The operation of A/D converter 210 is further detailed in Table 1 below.

TABLE 1

| Cell Gate Voltage | S0 | S1 | S2 | Bit1 | Bit0 |
|---|---|---|---|---|---|
| Vg < Vt1 | 0 | 0 | 0 | 0 | 0 |

TABLE 1-continued

| Cell Gate Voltage | S0 | S1 | S2 | Bit1 | Bit0 |
|---|---|---|---|---|---|
| Vt1 < Vg < Vt2 | 1 | 0 | 0 | 0 | 1 |
| Vt2 < Vg < Vt3 | 1 | 1 | 0 | 1 | 0 |
| Vg > Vt3 | 1 | 1 | 1 | 1 | 1 |

A/D converter 210 may be modified to convert the variable input voltage to other numbers of binary bits. For an n-bit conversion, $(2^n-1)$ reference cells are required to distinguish $2^n$ analog levels. One sense amplifier is required for each reference cell. The decode logic 222 must be modified to decode $(2^n-1)$ signals. Of course, the reference current generator is used.

Figure 9:
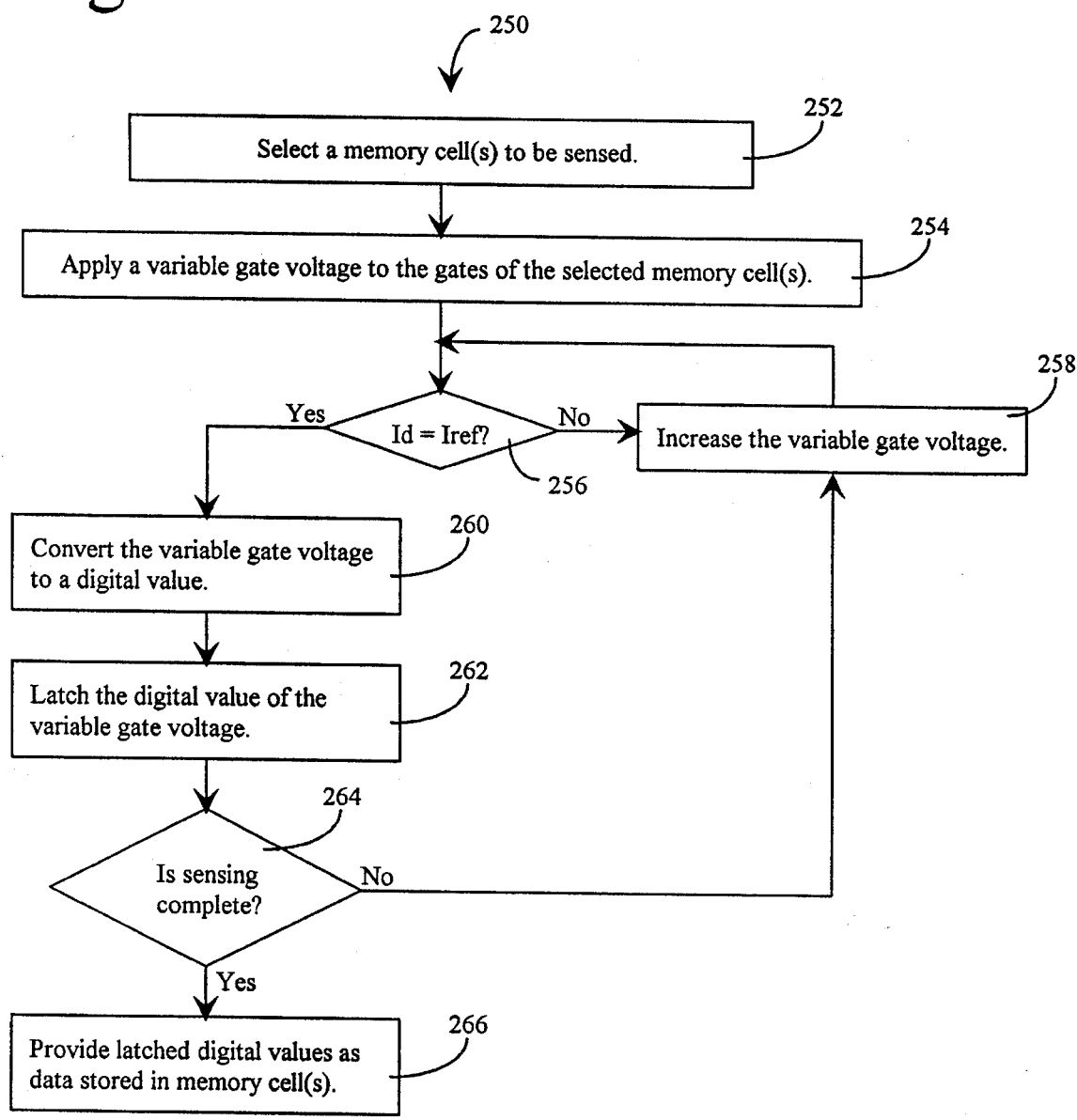
FIG. 9 is a flowchart of a method for sensing the state of a floating gate memory cell by applying a variable gate voltage.

FIG. 9 is a flowchart of a method 250 for sensing the state of a floating gate memory cell. During the operation of a memory device, sensing of memory cells to determine their state occurs in response to a request for data stored in the memory cells (i.e. a read operation) or during a verify operation during programming. Sensing method 250 begins in step 252 when memory cells are selected for sensing. The selection of particular memory cells for sensing is performed by the row and column select circuitry of the memory device.

After selection, at step 254 a variable gate voltage is applied to the gates of the selected memory cells. The variable gate voltage may be a step voltage, a ramp voltage, or other suitable type of variable voltage.

With the variable gate voltage applied, at step 256 a determination is made whether the resulting cell current $I_D$ for any of the sensed cells is equal to a reference current $I_{REF}$. If not, method 250 proceeds to step 258. If so, method 250 proceeds to step 260.

For one embodiment, step 258 increases the variable gate voltage. For another embodiment, the variable gate voltage is decreased. For yet another embodiment, the variable gate voltage is changed in a predetermined manner. After changing the variable gate voltage, method 250 proceeds to step 256 to again compare the cell currents to the reference current.

If any of the cell currents was equal to the reference current, at step 260 the variable gate voltage is converted to a digital value. For one embodiment, the digital conversion is performed by an A/D converter. For another embodiment, the input to a D/A converter provides the convened digital value. The digital value of the variable gate voltage represents the state of the cells whose cell currents matched the reference current.

For each of the cells whose cell current matched the reference current, at step 262 the converted digital value of the variable gate voltage is latched in latches corresponding to those cells.

At step 264 a determination is made whether sensing has been completed for all of the cells that were selected for sensing. Since different cells may store different states, state sensing for individual cells may occur at different times. If sensing is not complete, method 250 jumps back to step 258 to change the variable gate voltage and continue sensing of the remaining selected cells. If all selected cells have been sensed, method 250 proceeds to step 266 to provide the latched digital values as the data stored in the selected memory cells.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus for determining a state of a memory cell that is programmed to one of a plurality of states, comprising:

a voltage circuit that applies a variable voltage to a gate of the memory cell during a data reading operation, wherein the memory cell generates a cell current that is proportional to the variable voltage;

a reference current circuit that provides a fixed reference current;

a current comparing circuit coupled to the memory cell and the reference current circuit, the current comparing circuit detecting when the cell current is substantially equal to the fixed reference current, wherein the cell current is substantially equal to the fixed reference current when the variable voltage assumes a first voltage value that reflects the state of the memory cell; and a state sensing circuit coupled to the current comparing circuit, the state sensing circuit determining the state of the memory cell according to the first voltage value of the variable voltage at which the cell current is substantially equal to the fixed reference current.

2. The apparatus of claim 1, further comprising:

a converting circuit that converts the first voltage value of the variable voltage to a digital value, wherein the digital value represents the state of the memory cell when the cell current is substantially equal to the fixed reference current.

3. The apparatus of claim 2, wherein the state sensing circuit further comprises a latch that latches the digital value from the converting circuit when the current comparing circuit detects that the cell current is substantially equal to the fixed reference current.

4. The apparatus of claim 1, further comprising:

a digital-to-analog converter, coupled to the gate of the memory cell, for generating the variable voltage; and a counter, coupled to the digital-to-analog converter, for providing one of a plurality of digital values to the digital-to-analog converter, wherein the digital-to-analog converter generates the variable voltage in response to the provided digital value.

5. The apparatus of claim 4 further comprising a latch, responsive to the current comparing circuit, for latching the digital value provided to the digital-to-analog converter when the cell current is substantially equal to the fixed reference current, wherein the latched digital value represents the state of the memory cell.

6. The apparatus of claim 5 wherein the counter provides sequential digital values such that the variable voltage is a stepped voltage.

7. The apparatus of claim 1 further comprising an analog-to-digital converter, coupled to receive the variable voltage, for converting the variable voltage to a digital value.

8. The apparatus of claim 7 further comprising a latch circuit, responsive to the current comparing circuit, for latching the digital value when the cell current is substantially equal to the fixed reference current, wherein the latched digital value represents the state of the memory cell.

9. The apparatus of claim 8 wherein the analog-to-digital converter comprises a plurality of programmable reference cells, the variable voltage being applied to the programmable reference cells.

10. The apparatus of claim 9 wherein the variable voltage is a ramp voltage.

11. The apparatus of claim 1, wherein the fixed reference current is chosen such that the cell current is substantially independent of temperature when the state sensing of the memory cell occurs, wherein the state sensing is substantially independent of temperature.

12. The apparatus of claim 11 wherein the fixed reference current is between about 10–20 μA.

13. The apparatus of claim 11 wherein the fixed reference current is chosen such that variation in transconductance of the memory cells is also minimized.

14. An apparatus, comprising:

a memory cell having a floating gate, wherein the memory cell is programmed to one of a plurality of states corresponding to an amount of charge stored on the floating gate, the memory cell having a top gate, a source, and a drain;

a bias circuit coupled between the drain and source of the memory cell, for establishing a fixed voltage across the source and drain of the memory cell;

a variable voltage circuit coupled to the top gate of the memory cell, the variable voltage circuit applies a variable voltage to the top gate of the memory cell during a data reading operation, wherein the memory cell generates a cell current proportional to the variable voltage;

a reference current circuit that provides a substantially constant reference current;

a sensing circuit coupled to the reference current circuit and the memory cell, the sensing circuit indicating when the cell current is substantially equal to the reference current, wherein the cell current is substantially equal to the reference current when the variable voltage assumes a voltage value that reflects the state of the memory cell;

a first circuit coupled to the variable voltage circuit, the first circuit generating a digital value corresponding to the voltage value of the variable voltage; and a latch coupled to the first circuit and responsive to the sensing circuit, the latch latching the digital value when the cell current is substantially equal to the reference current, wherein the latched digital value represents the state of the memory cell.

15. The apparatus of claim 14 wherein the variable voltage circuit is a digital-to-analog converter and the first circuit is a counter.

16. The apparatus of claim 14 wherein the variable voltage is a ramp voltage and the first circuit is an analog-to-digital converter.

17. The apparatus of claim 14 wherein the reference current is chosen such that the cell current is substantially independent of temperature when the cell current is substantially equal to the fixed current.

18. The apparatus of claim 17 wherein the reference current is between about 10–20 μA.

19. The apparatus of claim 18 wherein the reference current is chosen such that variation in transconductance of the memory cells is also minimized.

20. An apparatus for determining a state of a memory cell that is programmed to one of a plurality of states, comprising:

means for applying a variable voltage to a gate of the memory cell during a data reading operation, wherein the memory cell generates a cell current that is proportional to the variable voltage;

means for providing a fixed reference current;

means for detecting when the cell current is substantially equal to the fixed reference current, wherein the cell current is substantially equal to the fixed reference current when the variable voltage assumes a first voltage value that reflects the state of the memory cell; and means for determining the state of the memory cell according to the first voltage value of the variable voltage at which the cell current is substantially equal to the fixed reference current.

21. The apparatus of claim 20, further comprising:

means for converting the first voltage value of the variable voltage to a digital value, wherein the digital value represents the state of the memory cell when the cell current is substantially equal to the fixed reference current.

22. The apparatus of claim 21 further comprising: means, responsive to the equal current detecting means, for latching the digital value when the cell current is substantially equal to the fixed reference current.

23. A method for sensing a state of a memory cell that is programmed to one of a plurality of states, comprising the steps of:

applying a variable voltage to a gate of the memory cell during a data reading operation, wherein the memory cell generates a cell current that is proportional to the variable voltage;

providing a fixed reference current;

detecting when the cell current is substantially equal to the fixed reference current, wherein the cell current is substantially equal to the fixed reference current when the variable voltage assumes a first voltage value that reflects the state of the memory cell; and determrining the state of the memory cell according to the first voltage value of the variable voltage at which the cell curent is substantially equal to the fixed reference current. determining the state of the memory cell according to a value of the variable gate voltage when the cell current is substantially equal to the fixed reference current.

24. The method of claim 23, further comprising the step of converting the first voltage value of the variable voltage to a digital value, wherein the digital value represents the state of the memory cell when the cell current is substantially equal to the fixed reference current.

25. The apparatus of claim 24 further comprising the step of latching the digital value when the cell current is substantially equal to the fixed reference current, wherein the latched digital value represents the state of the memory cell.

26. A method for sensing the state of a memory cell, comprising the steps of:

selecting a memory cell to be sensed;

applying a variable gate voltage to a gate of the selected memory cell during a data reading operation, wherein the memory cell generates a cell current proportional to the variable gate voltage;

providing a fixed reference current;

determining whether the cell current is substantially equal to the fixed reference current, wherein the cell current is substantially equal to the fixed reference current when the variable gate voltage assumes a first voltage value that reflects the state of the memory cell;

providing a digital value corresponding to the first voltage value of the variable gate voltage when the cell current is substantially equal to the fixed reference current; and latching the digital value when the cell current is substantially equal to the fixed reference current, wherein the latched digital value represents the state of the memory cell.

* * * * *

UNITED STATES PATENT AND TRADEMARK OFFICE
CERTIFICATE OF CORRECTION

PATENT NO. : 5,508,958
DATED : April 16, 1996
INVENTOR(S) : Fazio et al.

It is certified that error appears in the above-identified patent and that said Letters Patent is hereby corrected as shown below:

In column 2 at line 56 delete "convened" and insert --converted--

In column 10 at line 46 delete "convened" and insert --converted--

In column 13 at line 34 delete "determrining" and insert --determining--

In column 14 at line 1 following "current." delete "determining the state of the memory cell according to a value of the variable gate voltage when the cell current is substantially equal to the fixed reference current."

Signed and Sealed this

Twenty-second Day of July, 1997

*Attest:*

BRUCE LEHMAN

*Attesting Officer*   *Commissioner of Patents and Trademarks*